US007357649B2

(12) United States Patent
Asao

(10) Patent No.: US 7,357,649 B2
(45) Date of Patent: Apr. 15, 2008

(54) ELECTRICAL JUNCTION BOX FOR MOTOR VEHICLE

(75) Inventor: Takahiro Asao, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 11/475,149

(22) Filed: Jun. 27, 2006

(65) Prior Publication Data

US 2007/0015384 A1 Jan. 18, 2007

(30) Foreign Application Priority Data

Jul. 14, 2005 (JP) ............................ 2005-206111

(51) Int. Cl.
*H01R 12/00* (2006.01)

(52) U.S. Cl. ..................................................... 439/76.2

(58) Field of Classification Search ........... 439/620.27, 439/620.34, 76.2, 721–724, 212, 92, 723, 439/110, 214, 949; 361/775; 174/72 B, 174/71 B, 70 B, 59, 68.1, 68.2; 411/107
See application file for complete search history.

(56) References Cited

U.S. PATENT DOCUMENTS 5,088,940 A * 2/1992 Saito ..................... 439/620.34
5,795,193 A * 8/1998 Yang ..................... 439/620.27
6,322,376 B1 * 11/2001 Jetton ........................ 439/76.2

FOREIGN PATENT DOCUMENTS

| | | |
|---|---|---|
| JP | U 6-26141 | 4/1994 |
| JP | U 6-43993 | 6/1994 |
| JP | A 9-80080 | 3/1997 |
| JP | A 2000-270439 | 9/2000 |

* cited by examiner

*Primary Examiner*—Edwin A. Leon
(74) *Attorney, Agent, or Firm*—Oliff & Berridge, PLC

(57) ABSTRACT

An electrical junction box including a casing assembly including an upper casing and a lower casing, a laminated body contained in the casing assembly and layering bus bars and insulation plates alternately, and an electrical current sensor attached to a predetermined bus bar. The predetermined bus bar out of the bus bars is divided into a first bus bar member that passes a through-hole in the electrical current sensor and a second bus bar member to be connected to the first bus bar member by a bolt B and a nut N after the first bus bar member passes the through-hole. A nut-receiving recess for the nut N is provided on a bottom side of the lowermost insulation plate of the laminated body. The lower casing is provided with an attachment hole for the bolt. The bolt passes upward through the attachment hole and passes connecting portions of the first and second bus bars and is fastened and secured to the connecting portions by the nut. This structure reduces the risk of contact between the head of a bolt for fastening a bus bar that passes an electrical current sensor contained in a casing assembly of an electrical junction box and a bus bar constituting a laminated body.

2 Claims, 3 Drawing Sheets

ELECTRICAL JUNCTION BOX FOR MOTOR VEHICLE

This invention relates to an electrical junction box to be mounted on a motor vehicle in which, for example, an electrical current sensor is contained in a casing assembly to detect an electrical current in a bus bar. This application claims priority from Japanese Patent Application Number JP-2005-206111, filed Jul. 14, 2005, the contents of which are incorporated herein by reference.

BACKGROUND

Conventionally, some electrical junction boxes to be mounted on a motor vehicle include an electrical current sensor that detects an electrical current in a bus bar.

For example, Japanese Patent Public Disclosure No. HEI 9-80080 (JP-A-9-80080) discloses an electrical junction box 1, as shown in FIG. 3. In the electrical junction box 1, a first bus bar 3 is inserted into a through-hole 2*a* in an electrical current sensor 2. The first bus bar 3 and a second bus bar 4 are secured to a casing 5 by a nut N and a bolt B in a downstream side. The nut N is embedded in a connecting portion 6 in the casing 5. As shown in FIG. 4, the bolt B is inserted through an inner side or an upper side of the casing into bolt holes 3*a*, 4*a* in the first and second bus bars 3, 4, respectively, to be fastened by the nut N. After fastening the bolt, a bolt head B1 is disposed in the casing 5.

SUMMARY

In the electrical junction box disclosed in JP-A-9-80080, a laminated body 9, which layers the bus bars 7 and insulation plates 8 alternately, is arranged above the electrical current sensor 2 and the first and second bus bars 3, 4 in the casing 5. There may be a possibility of a short circuit when the bolt head B1 of the bolt B, which secures the first and second bus bars 3, 4 to each other, is brought into contact with the lowermost bus bar 7A in the laminated body 9.

In the case where the laminated body 9 is contained in the casing 5 after fastening the first and second bus bars 3, 4 by the bolt and then the second bus bar 4 is fastened to the bus bar 7 in the laminated body 9 by the bolt, a step of placing the laminated body 9 in the casing 5 is required between the respective bolt-fastening works. Consequently, the bolt-fastening works cannot be carried out by a single step, lowering efficiency in working.

On the contrary, in the case where the laminated body 9 is contained in the casing 5 before fastening the first and second bus bars 3, 4 by the bolt and then the bolt is inserted downward into a through-hole (not shown) in the respective insulation plates 8 in the laminated body 9 to fasten the first and second bus bars 3, 4 to each other, two bolt-fastening works mentioned above (a work of connecting the first and second bus bars 3, 4 and a work of connecting the second bus bar 4 and the bus bar 7) can be done by a single step. However, this construction cannot arrange the bus bar 7 at a position for passing the bolt on the laminated body 9 and reduces efficiency in arrangement of the bus bar.

In view of the above problems, an object of exemplary embodiments of the present invention is to prevent contact between a head of a bolt for fastening a bus bar that passes an electrical current sensor contained in a casing assembly of an electrical junction box and a bus bar constituting a laminated body.

In order to overcome the above problems, exemplary embodiments of the present invention provide an electrical junction box including: a casing assembly including an upper casing and a lower casing, a laminated body contained in the casing assembly comprising layered bus bars and insulation plates alternately, and an electrical current sensor attached to a predetermined bus bar of one of the bus bars. The electrical junction box may be mounted on a motor vehicle. The predetermined bus bar is divided into a first bus bar member that passes a through-hole in the electrical current sensor and a second bus bar member to be connected to the first bus bar member by a bolt and a nut after the first bus bar member passes the through-hole. A nut-receiving recess is provided on a bottom side of the lowermost insulation plate in the laminated body, and the lower casing is spaced away from the lowermost insulation plate by a given space and provided with an attachment hole for a bolt. Connecting portions of the first and second bus bar members are disposed in the space between the lowermost insulation plate and the lower casing, and the bolt passes the attachment hole in the lower casing upward and passes the connecting portions of the first and second bus bars to be fastened and secured to the connecting portions by the nut.

In more detail, in the above electrical junction box to be mounted on a motor vehicle, the electrical current sensor may be contained in the space between the lowermost insulation plate and the lower casing. Each end of the first and second bus bar members may be bent to form a lower end bent portion to be disposed in the space. The lower end bent portion of the first bus bar member passes the through-hole in the electrical current sensor. A distal end of the lower end bent portion of the first bus bar member is layered on the lower end bent portion of the second bus bar member. A bolt is inserted into the bolt holes in the layered lower end bent portions and fastened by a nut. The other ends of the first and second bus bar members are electrically coupled to fusible links.

According to the above structure, since the first and second bus bar members are not downward fastened and secured to the lower casing by the bolt but are instead upward fastened and secured to the lowermost insulation plate in the laminated body by the bolt, the head of the bolt is arranged on the bottom side of the first and second bus bar members. Accordingly, the bolt head is not opposed to the bus bars in the laminated body and it is possible to reduce the risk of a short circuit due to contact between the bolt head and the lowermost bus bar.

Also, since a bolt fastens upward the first and second bus bar members, it is not necessary for the bolt to pass the laminated body disposed above the first and second bus bar members and an arrangement of the bus bars is not limited by penetration of the bolt.

It is preferable that any bus bar other than the predetermined bus bar is not disposed on a bottom side of the lowermost insulation plate. A certain bus bar other the predetermined bus bar may be disposed at a certain position in the casing assembly, so long as the certain position is spaced away from the bolt that secures the first and second bus bar members to each other to positively avoid contact between the bolt head and the certain bus bar.

In the case where the first bus bar member and/or the second bus bar member are or is connected to the bus bar constituting the laminated body by bolt-fastening, it is necessary to carry out at least two bolt-fastening works including a work of fastening and securing the first and second bus bar members to each other by the bolt and a work of fastening the first and second bus bar members on the bus bar in the laminated body. However, since these bolt-fastening works are carried out after the laminated body is placed in the lower casing, it is possible to efficiently perform these bolt-fastening works by a single step.

The bolt-fastening works are not limited to the above works. It is possible to carry out a work of connecting the first and second bus bar members to a terminal on a distal end of a power supply wire connected to a battery and a work of connecting the first and second bus bar members to terminals of fusible links by a single step.

As described above, according to exemplary embodiments the present invention, since the first bus bar member passing the through-hole in the electrical current sensor and the second bus bar member are upward fastened and secured to the lowermost insulation plate in the upper laminated body by the bolt, the head of the bolt is arranged on the bottom side of the first and second bus bar members. Accordingly, it is possible to reduce the risk of a short circuit due to contact between the bolt head and the lowermost bus bar in the laminated body.

Also, since a bolt fastens upward the first and second bus bar members, it is not necessary for the bolt to pass the laminated body disposed above the first and second bus bar members. An arrangement of the bus bars is not limited by penetration of the bolt and a space above the insulation plate can be effectively utilized.

Furthermore, the work of fastening the first and second bus bar members by the bolt can be carried out simultaneously with the bolt-fastening work after placing the laminated body in the lower casing by a single step and efficiency in the bolt-fastening work can be enhanced.

These and other objects, advantages and features are described in or apparent from the following detailed description

BRIEF DESCRIPTION OF THE DRAWINGS

Exemplary embodiments will be described in connection with the attached drawings, in which like numerals represent like parts, and in which.

DETAILED DESCRIPTION OF EMBODIMENTS

Figure 1:
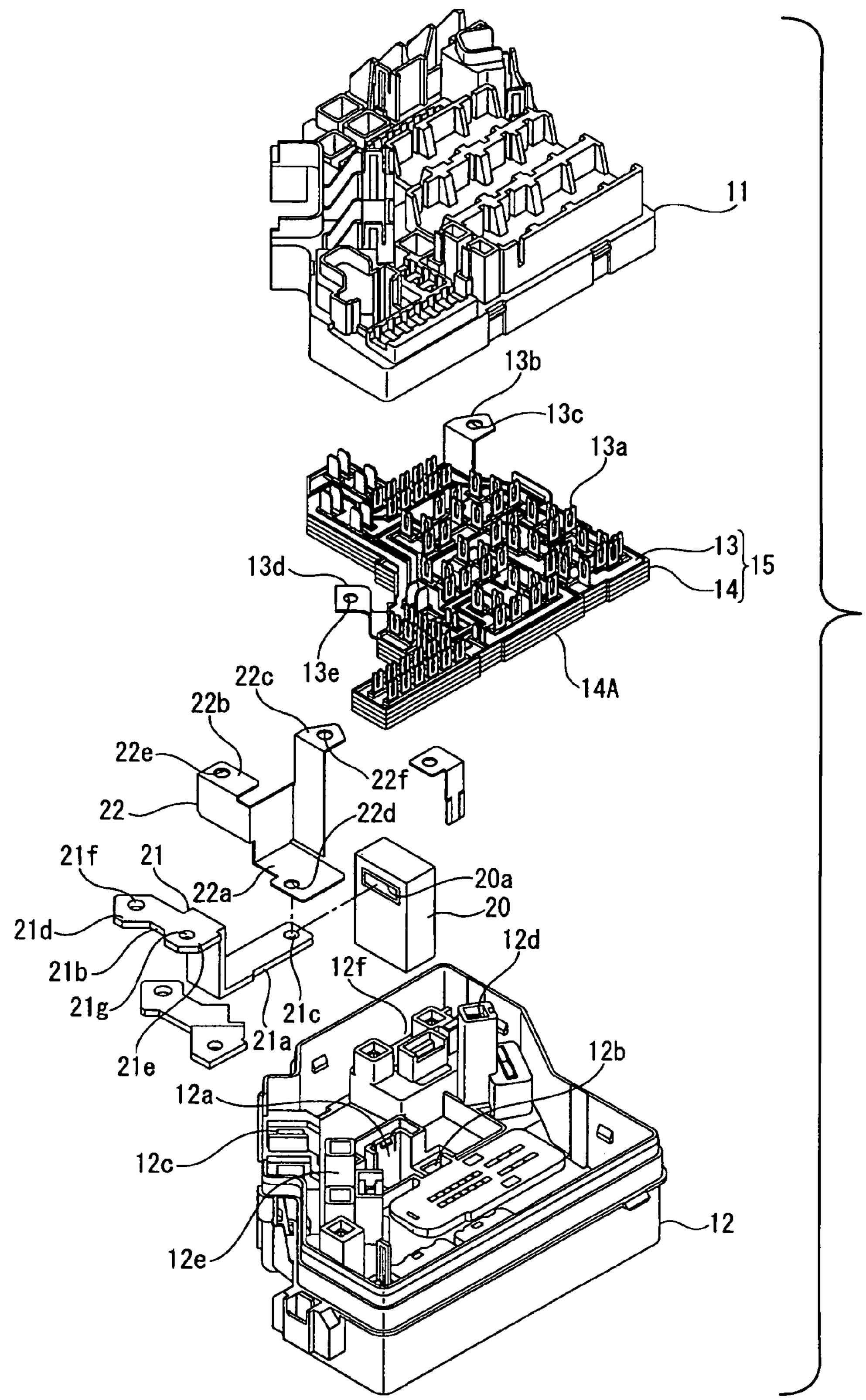
FIG. 1 is an exploded perspective view of an embodiment of an electrical junction box for a motor vehicle in accordance with the present invention.

Referring now to the drawings, an embodiment of an electrical junction box in accordance with the present invention will be described below.

Figure 2:
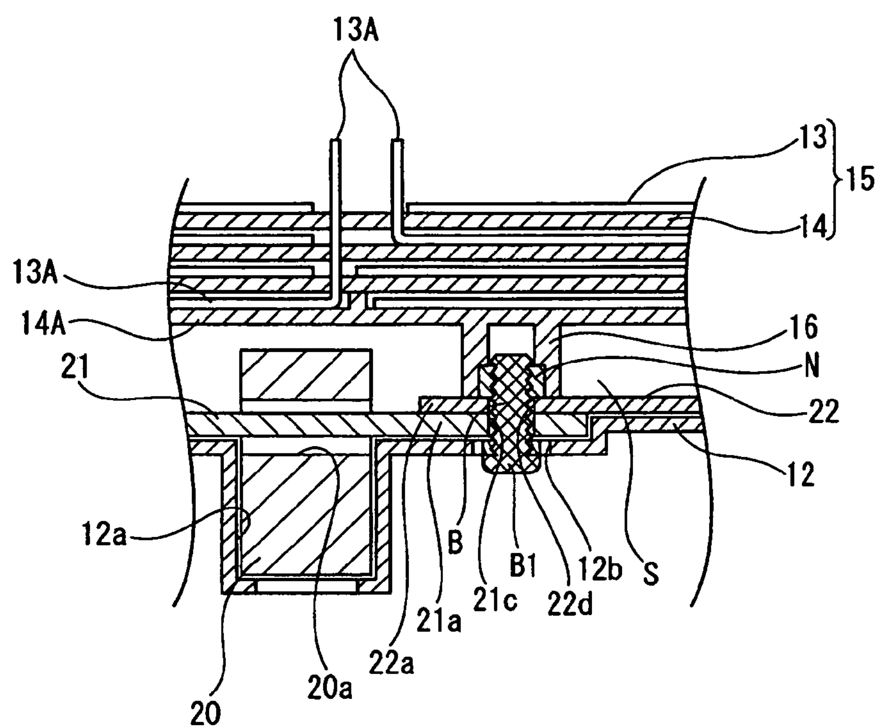
FIG. 2 is a sectional view of a part of the electrical junction box shown in FIG. 1, illustrating a first bus bar member and a second bus bar member fastened on an insulation plate by a bolt.
Figure 3:
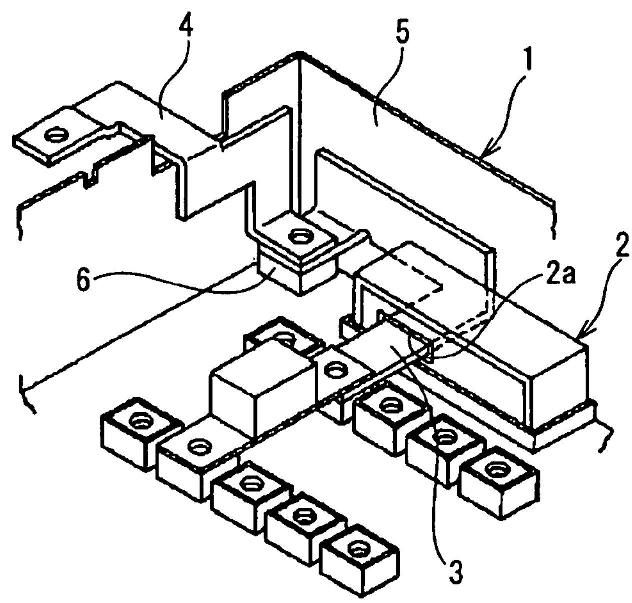
FIG. 3 is a perspective view of a part of a conventional electrical junction box for a motor vehicle.
Figure 4:
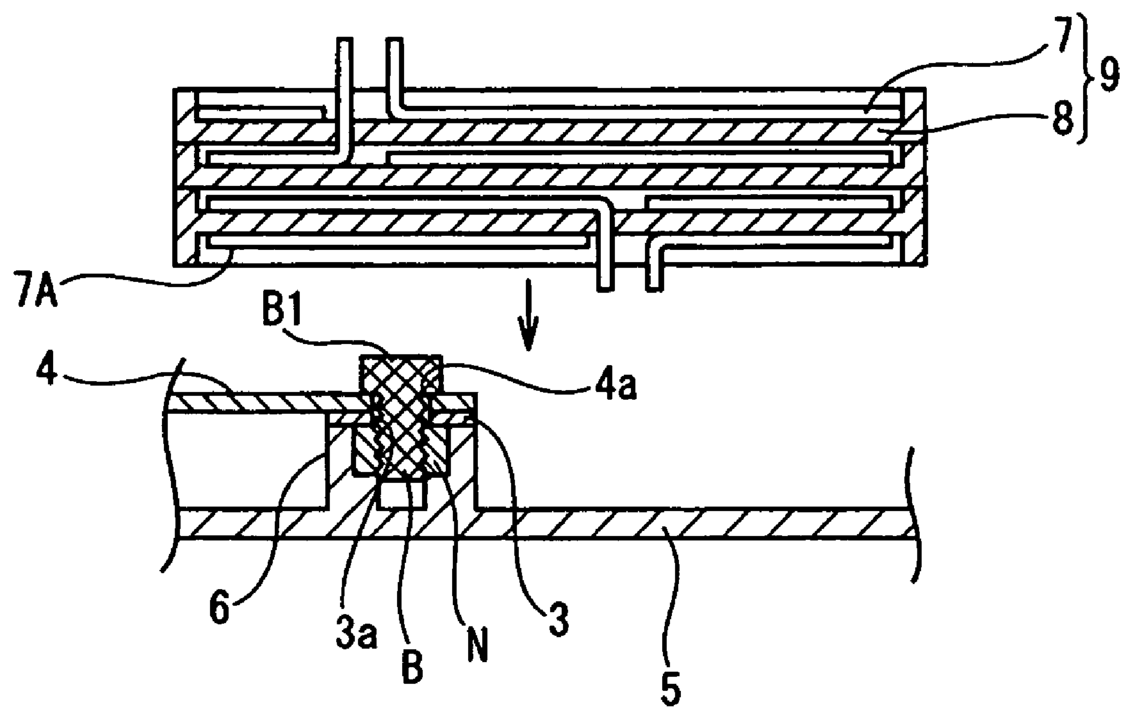
FIG. 4 is a sectional view of a part of the conventional electrical junction box, illustrating a problem in the box.

FIGS. 1 and 2 show an embodiment of the present invention. An electrical junction box 10 includes a casing assembly including an upper casing 11 and a lower casing 12, and a laminated body 15 contained in the casing assembly and layering bus bars 13 and insulation plates 14 alternately. A predetermined bus bar out of the bus bars 13 includes a first bus bar member 21 to be inserted into a through-hole 20*a* in an electrical current sensor 20 and a second bus bar member 22 to be connected to and fastened on the first bus bar member 21 by a bolt B.

The electrical current sensor 20 detects an electrical current that flows in the first bus bar member 21. The electrical current sensor 20 is provided with the through-hole 20*a* to pass the first bus bar member 21. An electrical wire (not shown) may be connected through a connector to a bottom side of the electrical current sensor 20. When the sensor 20 detects the electrical current, the sensor 20 may transmit a detecting signal to an engine control unit (not shown).

Punching and bending a conductive metal plate into a desired shape forms the first bus bar member 21. The first bus bar member 21 includes a lower end bent portion 21*a* that extends from one end of the member 21 in a horizontal direction and an upper end bent portion 21*b* that extends from the other end of the member 21. The lower end bent portion 21 a passes the through-hole 20*a* in the electrical current sensor 20 so that a distal end projected from the through-hole 20*a* forms a connecting portion to be joined to the second bus bar member 22. The connecting portion is provided with a bolt hole 21*c*. The upper end bent portion 21*b* includes a connecting portion 21*d* to be connected to a terminal (not shown) on a distal end of a power supply wire connected to a battery and a connecting portion 21*e* to be connected to an input terminal of a fusible link. These connecting portions 21*d* and 21*e* are provided with bolt holes 21*f* and 21*g*, respectively.

The second bus bar member 22 to be connected to the first bus bar member 21 by a bolt includes a lower end bent portion 22*a* that extends from one end of the member 22 in a horizontal direction and upper end bent portions 22*b* and 22*c* that extend from the other end of the member 22. A distal end of the lower end bent portion 22*a* serves to be a connecting portion for joining the first bus bar member 21. The connecting portion is provided with a bolt hole 22*d*. The one upper end bent portion 22*b* is provided with a bolt hole 22*e* for coupling the fusible link while the other upper end bent portion 22*c* is provided with a bolt hole 22*f* for joining the bus bar 13.

The distal ends of the lower end bent portions 21*a* and 22*a* of the first and second bus bar members 21 and 22 are provided with the bolt holes 21*c* and 22*d* and serve to be a part for layering the first and second bus bar members 21 and 22 to each other.

As shown in FIG. 2, the bus bars 13 other than the predetermined bus bar members (the first and second bus bar members 21 and 22) are disposed on the laminated body 15 at an upper side of the lowermost insulation plate 14A. The lowermost bus bar 13A is disposed on the lowermost insulation plate 14A. The lowermost insulation plate 14A projects downward at the bottom side to form a nut-receiving recess 16 with a rectangular parallelepiped configuration. A quadrangular nut N is press-fitted in the recess 16. Other shapes are also acceptable for the nut and precess.

As shown in FIG. 1, the bus bar 13 is provided with a plurality of tabs. Tabs 13*a* standing upward from the laminated body 15 may be connected to terminals of fuses and relays (not shown) mounted on the upper casing 11 while tabs (not shown) projecting downward from the laminated body 15 is connected to terminals in connectors mounted on the lower casing 12.

Furthermore, as shown in FIG. 1, two bus bars project upward from the sides of the laminated body 15. Each of the bus bars includes an upper end bent horizontally. One of the upper bent ends is provided with a bolt hole 13*c* to form a connecting portion 13*b* for the second bus bar member 22 while the other of the upper bent ends is provided with a bolt hole 13*e* to form a connecting portion 13*d* for a fusible link.

The lower casing 12 is provided on a desired position of a bottom wall with an attachment portion 12*a* for the electrical current sensor 20 and also provided near the attachment portion 12*a* with an attachment hole 12*b* that allows a bolt B to pass through so as to connect the first and second bus bar members 21, 22 to each other. The lower casing 12 includes a bolt fastening and connecting portion 12*c* for connecting the first bus bar member 21 to a terminal on a distal end of a power supply wire, a bolt fastening and connecting portion 12*d* for connecting the second bus bar member 22 to the connecting portion 13*b* of the bus bar 13, a first portion 12*e* on which a first fusible link is mounted, and a second portion 12*f* on which a second fusible link is mounted.

The lower end bent portion 21*a* of the first bus bar member 21 enters the electrical current sensor 20. When the electrical sensor 20 with the lower end bent portion 21*a*, the second bus bar member 22 and the laminated body 15 are placed in the lower casing 12 in order, the lower end bent portion 21*a* of the first bus bar member 21 and the lower end bent portion 22*a* of the second bus bar member 22 are layered on each other and disposed in a spaces defined between the lowermost insulation plate 14A and the lower casing 12, as shown in FIG. 2. In more detail, the attachment hole 12*b* in the lower casing 12, the bolt hole 21*c* in the first bus bar member 21, the bolt hole 22*d* in the second bus bar member 22, and the nut N in the nut-receiving recess 16 in the lowermost insulation plate 14A are aligned mutually in a vertical direction. Under this position, the bolt B is inserted upward through the bottom side of the lower casing 12 into the attachment hole 12*b*, and bolt holes 21*c*, 22*d* are engaged with the nut N, thereby fastening and securing the first and second bus bar members 21, 22 to the lowermost insulation plate 14A. At this time, a head B1 of the bolt B is disposed on the exterior of the lower casing 12.

Also, the first bus bar member 21 permits the connecting portion 21*d* to be fastened and secured to the terminal on the power supply wire and the connecting portion 21*e* to be fastened and secured to an input terminal of the fusible link (not shown) mounted on the first portion 12*e* for the first fusible link by the bolts at the desired positions in the lower casing 12, respectively.

In addition, the second bus bar member 22 permits the upper end bent portion 22*b* to be fastened and secured to an input terminal of the second fusible link (not shown) mounted on the second portion 12*f* for the second fusible link and the upper end bent portion 22*c* to be fastened and secured to the connecting portion 13*b* of the bus bar 13 by the bolts at the desired positions in the lower casing 12, respectively.

Furthermore, the connecting portion 13*d* of the bus bar 13 is fastened and secured to an output terminal of the first fusible link mounted on the first portion 12*e* for the first fusible link by the bolt at the desired position in the lower casing 12.

According to the above construction, since the first bus bar member 21, which passes the through-hole 20*a* in the electrical current sensor 20, and the second bus bar member 22 are fastened upward by the bolt and secured to the lowermost insulation plate 14A of the laminated body 15 that are disposed above the members 21, 22 the bolt head B1 is disposed on the bottom side of the first and second bus bar members 21, 22 thereby reducing the risk of a short circuit due to contact between the bolt head B1 and the lowermost bus bar 13A.

Also, by fastening the first and second bus bar members 21, 22 upward by the bolt, it is not necessary for the bolt to pass the laminated body 15 disposed above the first and second bus bar members 21, 22, so that an arrangement of the bus bar 13 is not limited due to penetration of the bolt, and it is possible to effectively utilize a space above the insulation plate 14.

Furthermore, it is possible to carry out a bolt fastening work for the first and second bus bar members 21, 22 simultaneously with a plurality of bolt fastening works after containing the laminated body 15 in the lower casing 12 in the same step, thereby enhancing the bolt fastening works.

Although the invention has been described with reference to specific embodiments, these embodiments should be viewed as illustrations and not limiting. Various modifications, substitutes and improvements are possible within the spirit and scope of the invention.

What is claimed is:

1. An electrical junction box comprising:

a casing assembly including an upper casing and a lower casing;

a laminated body contained in said casing assembly and layering bus bars and insulation plates alternately; and an electrical current sensor attached to a predetermined bus bar;

said predetermined bus bar being divided into (i) a first bus bar member that passes a through-hole in said electrical current sensor and (ii) a second bus bar member to be connected to said first bus bar member by a bolt and a nut after said first bus bar member passes said through-hole;

a nut-receiving recess being provided on a bottom side of the lowermost insulation plate in said laminated body;

said lower casing being spaced away from said lowermost insulation plate by a given space and provided with a attachment hole for a bolt;

connecting portions of said first and second bus bar members being disposed in said space between said lowermost insulation plate and said lower casing; and said bolt passing upward through said attachment hole in said lower casing and passing connecting portions of said first and second bus members to be fastened and secured to said connecting portions by said nut.

2. An electrical junction box according to claim 1, wherein:

said electrical current sensor is contained in said space between said lowermost insulation plate and said lower casing, each end of said first and second bus bar members is bent to form a lower end bent portion to be disposed in said space, said lower end bent portion of said first bus bar member passes said through-hole in said electrical current sensor, a distal end of said lower end bent portion of said first bus bar member is layered on said lower end bent portion of said second bus bar member, said bolt is inserted into said bolt holes in said layered lower end bent portions and fastened by said nut, and other ends of said first and second bus bar members are electrically coupled to fusible links.

* * * * *